US012763768B1

(12) United States Patent
Chang et al.

(10) Patent No.: US 12,763,768 B1
(45) Date of Patent: Oct. 13, 2026

(54) TWO-WIRE ELECTRONIC SWITCH APPARATUS

(71) Applicant: TONTEK DESIGN TECHNOLOGY LTD., New Taipei City (TW)

(72) Inventors: Yu-Chi Chang, New Taipei City (TW); Chin-Tsung Lin, New Taipei City (TW)

(73) Assignee: TONTEK DESIGN TECHNOLOGY LTD., New Taipei City (TW)

( * ) Notice: Subject to any disclaimer, the term of this patent is extended or adjusted under 35 U.S.C. 154(b) by 0 days.

(21) Appl. No.: 19/198,963

(22) Filed: May 5, 2025

(51) Int. Cl.
*H03K 17/96* (2006.01)
*H03K 17/687* (2006.01)

(52) U.S. Cl.
CPC ....... *H03K 17/9618* (2013.01); *H03K 17/687* (2013.01); *H03K 2017/9613* (2013.01)

(58) Field of Classification Search
CPC .. H03K 17/687; H03K 17/96; H03K 17/9618; H03K 2017/9613
USPC .................................................. 327/419, 517
See application file for complete search history.

(56) References Cited

U.S. PATENT DOCUMENTS

2004/0104826 A1* 6/2004 Philipp .................... G01D 5/24 341/33
2011/0267134 A1* 11/2011 Landmann ............. G05D 23/20 327/512
2015/0301654 A1* 10/2015 Chen .................... G09G 3/3208 345/174
2018/0101260 A1* 4/2018 Morita .................. G02F 1/1343
2020/0142527 A1* 5/2020 Wu ........................ G10K 1/062

* cited by examiner

*Primary Examiner* — William Hernandez
(74) *Attorney, Agent, or Firm* — MUNCY, GEISSLER, OLDS & LOWE, P.C.

(57) ABSTRACT

A two-wire electronic switch apparatus includes a touch pad, a touch chip, a first pin and a second pin, wherein the touch chip is coupled to the touch pad, and the touch chip further includes a touch sensor electrically connected to a controller. The controller is electrically connected to a gate of a field effect transistor. The first pin and the second pin are electrically connected to the source electrode and the drain electrode of the field effect transistor respectively. When the touch sensor senses that the touch pad is touched, the controller controls the source electrode and drain electrode of the field effect transistor to conduct, thus forming a touch switch to replace the traditional pushbutton switch.

7 Claims, 6 Drawing Sheets

TWO-WIRE ELECTRONIC SWITCH APPARATUS

BACKGROUND

Technical Field

This present invention relates to a two-wire electronic switch apparatus, especially a two-wire electronic switch apparatus used for replacing mechanical pushbutton switch and preventing switch performance degradation caused by moisture or mechanical aging.

Description of Prior Art

The prior art pushbutton switches are generally mechanical contact switches such as the mechanical contact switches shown in FIGS. 1, 2 and 3. FIG. 1 is a schematic diagram showing the appearance of a mechanical pushbutton switch. FIG. 2 is an equivalent circuit diagram of the mechanical pushbutton switch shown in FIG. 1. FIG. 3 is an electronic schematic diagram showing an application of the mechanical pushbutton switch.

The prior art mechanical pushbutton switch generally has a pushbutton bump PB on top face thereof, and a pressing spring piece and electronic contacts N12 and N34 therein. When an external force presses the pushbutton bump PB, the spring piece is pressed to connect the electronic contacts N12 and N34.

As shown in FIG. 3, each I/O pin of the main control chip is connected to a voltage source through a resistor, and connected to electronic contact N12 of the mechanical pushbutton switch. Besides, the electronic contact N34 of the mechanical pushbutton switch is connected to a ground end. When the pushbutton switch is not pressed, the I/O pin is input with a high-level voltage. When one of the pushbutton switches is pressed, the corresponding I/O pin is input with a low-level voltage. After long time operation of the prior art pushbutton switches, the spring piece suffers to age problem and short circuit problem due to failed spring action of the spring piece. Besides, the electronic contacts tend to oxidize and this causes poor contact in humid environment.

SUMMARY

In order to solve the above shortcomings, this invention provides a two-wire electronic switch, which uses touch technology to design the touch chip to have the same size as the traditional pushbutton switch and can replace the traditional pushbutton switch. The two-wire electronic switch of the present invention does not suffer to problem of aging or oxidation of the mechanical switch, and can be made on the back of the circuit board.

Accordingly, the present invention provides a two-wire electronic switching apparatus, including: a touch pad; a touch chip coupled to the touch pad, the touch chip comprising a touch sensor electrically connected to a controller, the controller connected to a gate of a field effect transistor; a first pin and a second pin electrically connected to a source and a drain of the field effect transistor respectively; wherein when the touch sensor senses that the touch pad is touched, the controller is configured to conduct the source and the drain of the field effect transistor to form a touch electronic switch to replace the traditional pushbutton switch.

DETAILED DESCRIPTION

The technical contents of the present disclosure will become apparent with the detailed description of embodiments and the accompanied drawings as follows. However, it shall be noted that the accompanied drawings are for illustrative purposes only such that they shall not be used to restrict the scope of the present disclosure.

Figure 1:
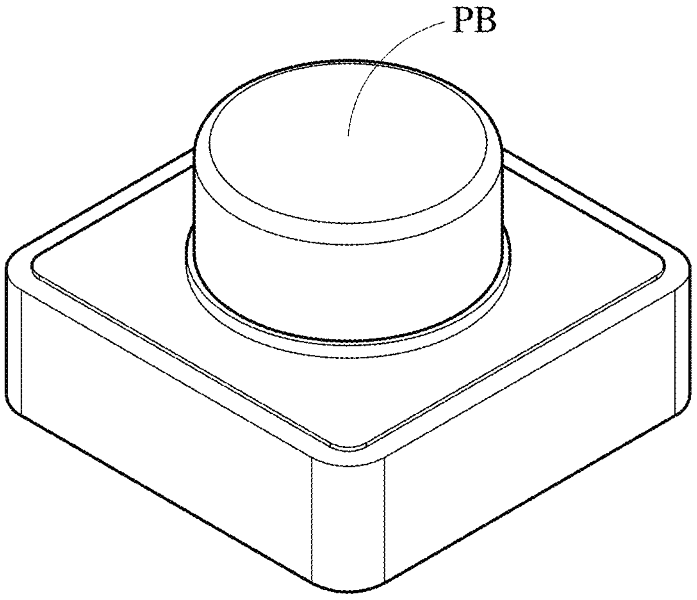
FIG. 1 PRIOR ART
FIG. 1 is a schematic diagram showing the appearance of a mechanical pushbutton switch.
Figure 2:
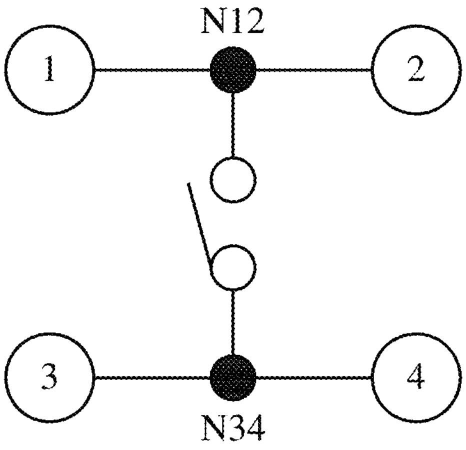
FIG. 2 PRIOR ART
FIG. 2 is an equivalent circuit diagram of the mechanical pushbutton switch shown in FIG. 1.
Figure 3:
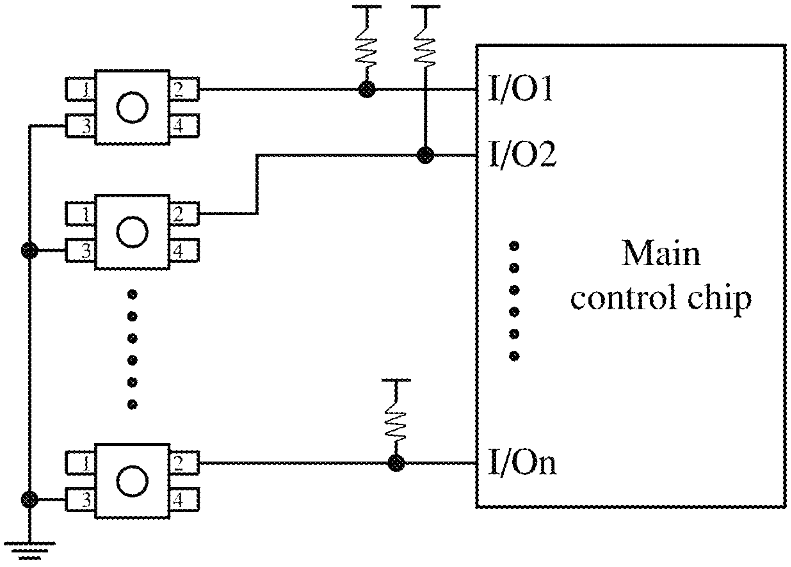
FIG. 3 PRIOR ART
FIG. 3 is an electronic schematic diagram showing an application of the mechanical pushbutton switch.
Figure 4:
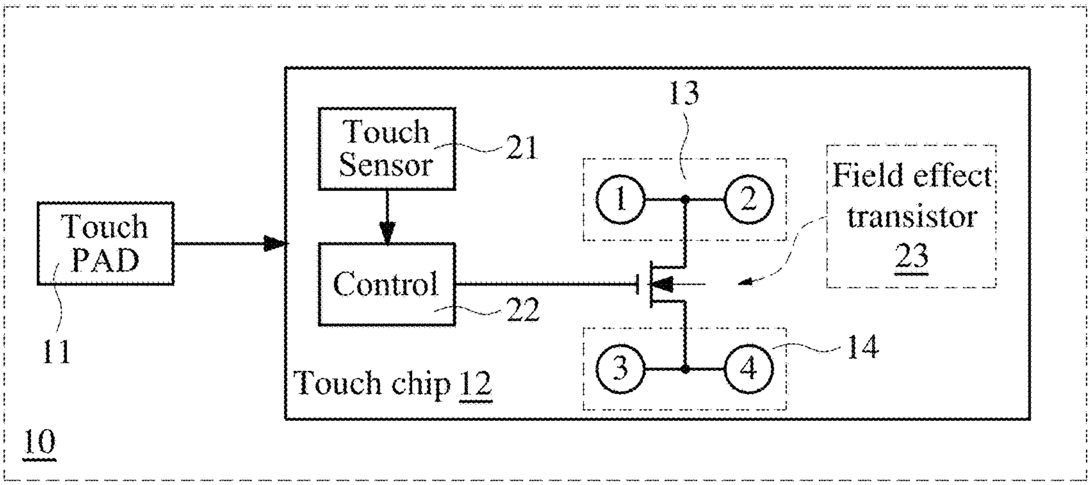
FIG. 4 is a schematic circuit structure diagram of a two-wire electronic switch apparatus according to the present invention.

Please refer to FIG. 4, this figure is a schematic circuit structure diagram of a two-wire electronic switch apparatus according to the present invention. The two-wire electronic switch apparatus of the present invention is hereinafter referred to as a touch electronic switch 10. As shown in FIG. 4, the touch electronic switch 10 includes a touch pad 11, a touch chip 12, a first pin 13 and a second pin 14. The touch chip 12 is coupled to the touch pad 11. The touch chip 12 includes a touch sensor 21, a controller 22 and a field effect transistor 23. The touch sensor 21 is electrically connected to the controller 22. The touch sensor 21 is used to sense whether the touch pad 11 is touched by a human body. When touch sensor 21 senses that the touch pad 11 is touched by a human body, the touch sensor 21 sends a touch signal to the controller 22.

The controller 22 is electrically connected to the gate of the field effect transistor 23, the first pin 13 is electrically connected to the source of the field effect transistor 23, and the second pin 14 is electrically connected to the drain of the field effect transistor 23. When the controller 22 receives the touch signal, the controller 22 sends a potential signal to the gate of the field effect transistor 23 to conduct the source and drain of the field effect transistor 23. Therefore, the first pin 13 is connected with the second pin 14 to form the touch electronic switch 10.

Figure 5:
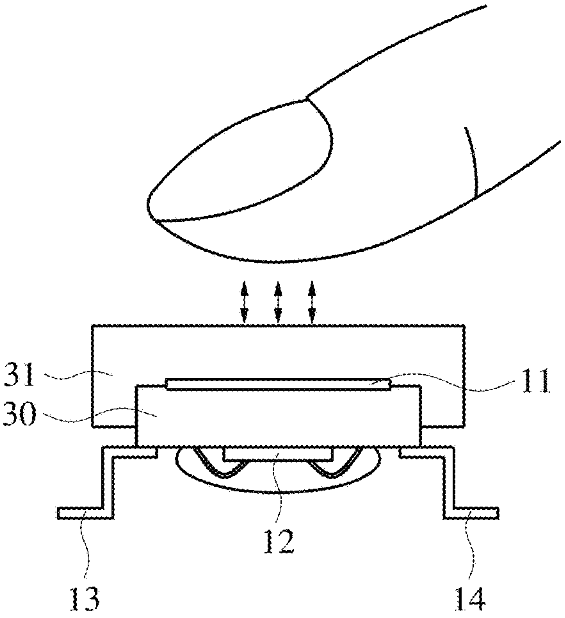
FIG. 5 is a schematic diagram of the two-wire electronic switch according to a first embodiment of the present invention.

Please refer to FIG. 5, this figure is a schematic diagram of the two-wire electronic switch according to a first embodiment of the present invention. In this embodiment, the touch chip 12 is packaged on the first surface of a circuit board 30, and the touch pad 11 is arranged on the second surface of the circuit board 30 opposite to the first surface. In other words, when the touch chip 12 is packaged on the lower surface of the circuit board 30, the touch pad 11 is arranged on the upper surface of the circuit board 30 and the position of the touch chip 12 is corresponding to the position of the touch chip 12. The touch electronic switch 10 further includes a cover plate 31 covering atop the touch pad 11 and providing a touch surface of human finger for the touch electronic switch 10. The first pin 13 and the second pin 14 of the touch electronic switch 10 are electrically soldered to a substrate of an electronic device (not shown).

Figure 6:
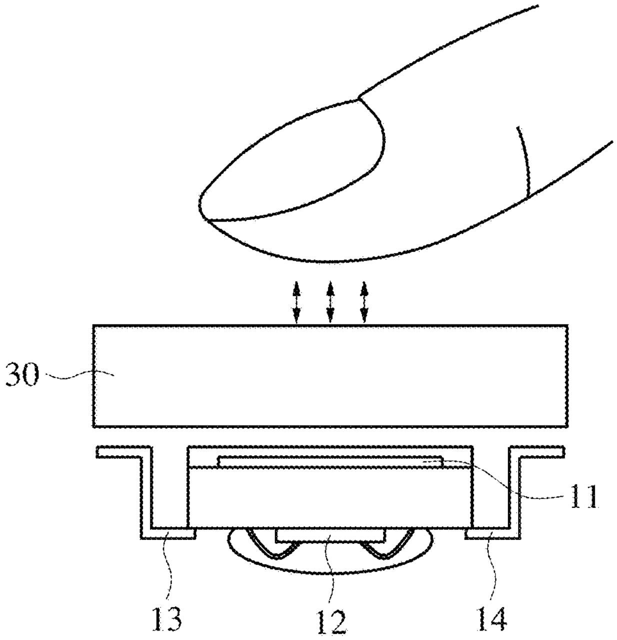
FIG. 6 is a schematic diagram of the two-wire electronic switch according to a second embodiment of the present invention.

Please refer to FIG. 6, this figure is a schematic diagram of the two-wire electronic switch according to a second embodiment of the present invention. In this embodiment, the touch pad 11 is disposed on the back of the touch chip 12. The first pin 13 and the second pin 14 are electrically soldered to one surface of the circuit board 30. The circuit board 30 can be the substrate of an electronic device, and the other surface (back surface) of the circuit board 30 forms a touch surface for human fingers to contact.

Figure 7A:
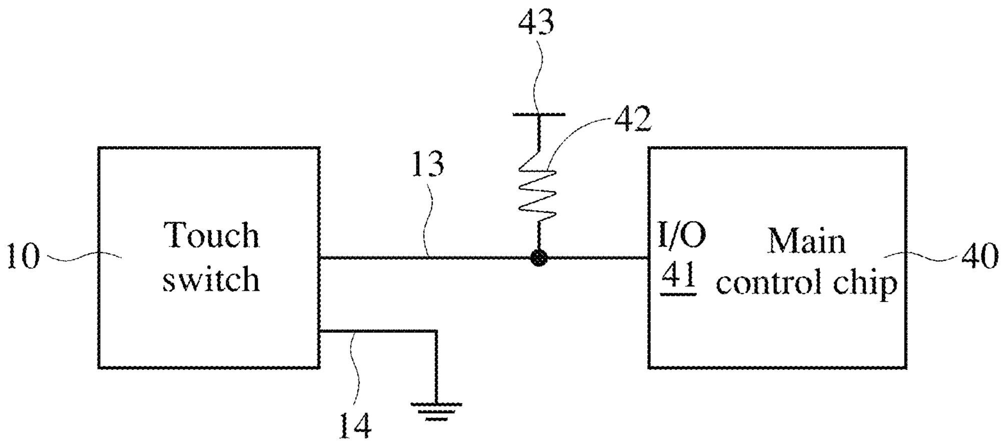
FIG. 7A is a schematic diagram of the two-wire electronic switch according to the first application embodiment of the present invention.
Figure 7B:
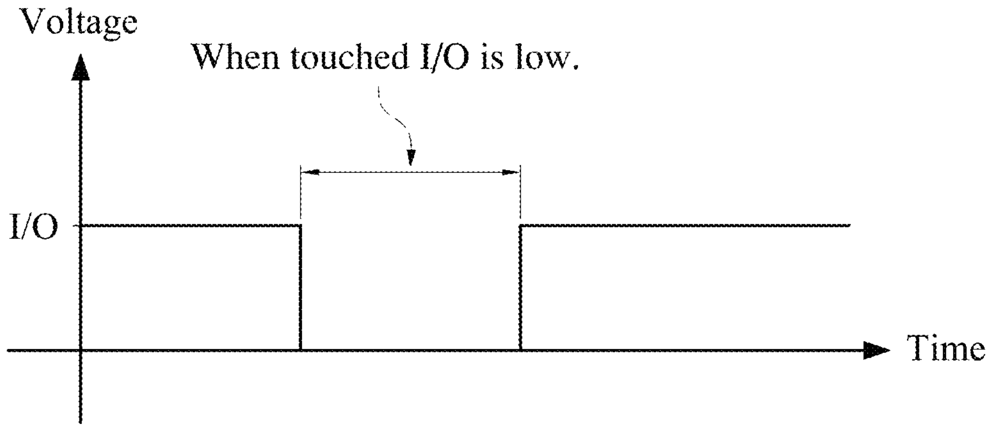
FIG. 7B is a schematic diagram showing the output waveform.

Please refer to FIG. 7A and FIG. 7B together, where FIG. 7A is a schematic diagram of the two-wire electronic switch according to the first application embodiment of the present invention, and FIG. 7B is a schematic diagram showing the output waveform. The touch electronic switch 10 of the present invention can be applied to a main control chip 40 and provides a touch input signal. As shown in FIG. 7A, the main control chip 40 includes an input terminal (I/O) 41. The first pin 13 of the touch electronic switch 10 is electrically connected to the input terminal 41 of the main control chip 40. The first pin 13 is electrically connected in series with a bias resistor 42 and electrically connected to a voltage source 43. The second pin 14 is electrically connected to a ground end. When the touch electronic switch 10 is not touched by the human body, the first pin 13 and the second pin 14 are open circuited therebetween, and the first pin 13 outputs a high potential to the input terminal 41 of the main control chip 40. When the touch switch 10 is touched by the human body, the first pin 13 and the second pin 14 are connected, and the first pin 13 outputs a low potential to the input terminal 41 of the main control chip 40 or outputs one or more pulse signal voltage to the input terminal 41 of the main control chip 40.

Figure 8A:
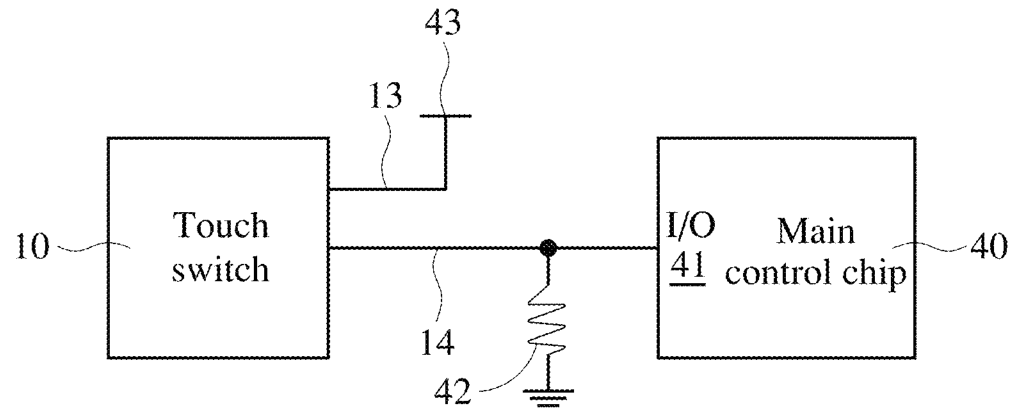
FIG. 8A is a schematic diagram of the two-wire electronic switch according to the second application embodiment of the present invention.
Figure 8B:
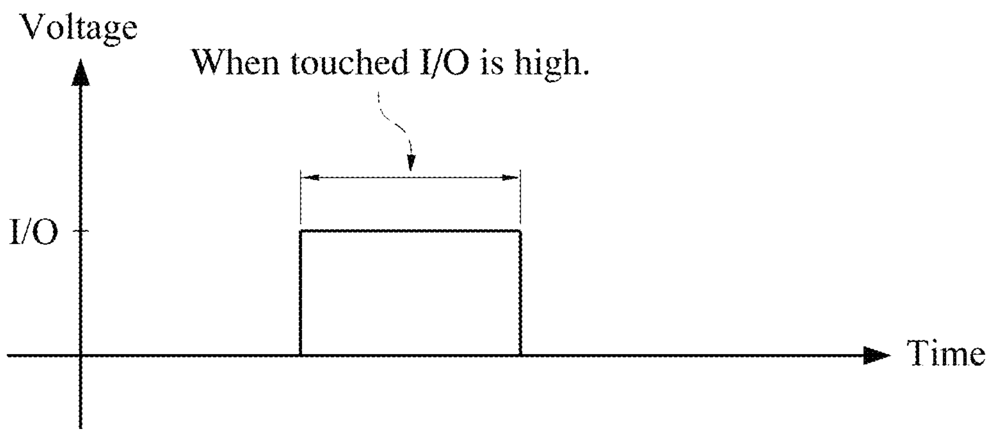
FIG. 8B is a schematic diagram showing the output waveform.

Please refer to FIG. 8A and FIG. 8B, where FIG. 8 is a schematic diagram of the two-wire electronic switch according to the second application embodiment of the present invention, and FIG. 8B is a schematic diagram showing the output waveform. In this application, the first pin 13 of the touch electronic switch 10 is electrically connected to the voltage source 43. The second pin 14 of the touch electronic switch 10 is electrically connected to the input terminal 41 of the main control chip 40, and is electrically connected in series with a bias resistor 42 and electrically connected to the ground end. When the touch electronic switch 10 is not touched by the human body, and the second pin 14 outputs a low potential to the input terminal 41 of the main control chip 40. When the touch switch 10 is touched by the human body, the first pin 13 and the second pin 14 are connected, and the second pin 14 outputs a high potential to the input terminal 41 of the main control chip 40.

Figure 9:
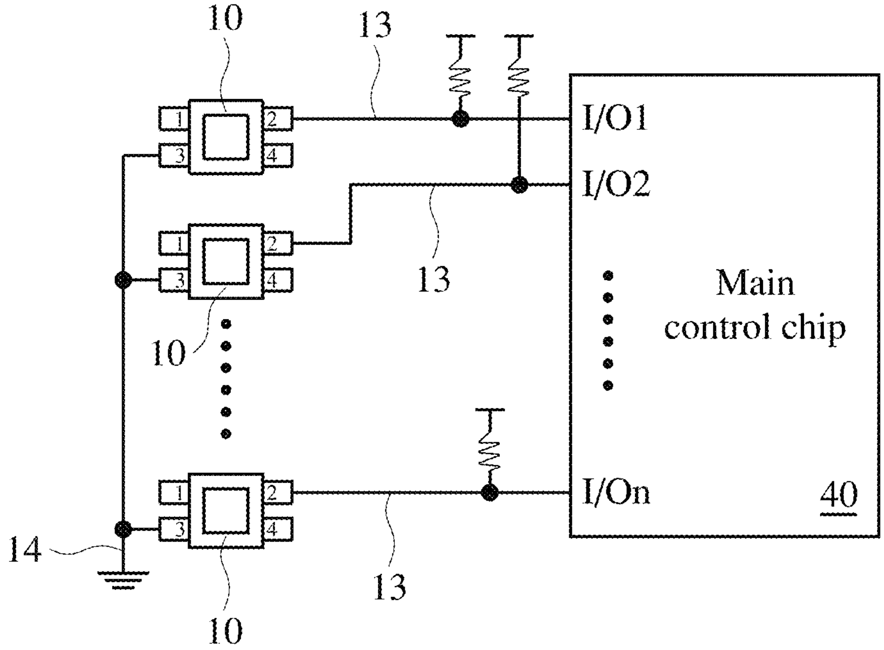
FIG. 9 is a schematic diagram of multiple sets of two-wire electronic switches according to an application embodiment of the present invention.

Please refer to FIG. 9, this figure is a schematic diagram of multiple sets of two-wire electronic switches according to an application embodiment of the present invention. In this application embodiment, multiple sets of touch electronic switches 10 are used to provide multiple sets of input touch signals for the main control chip 40. The main control chip 40 includes multiple sets of input terminals (I/O1~I/On) 41. The first pins 13 of the multiple sets of touch electronic switches 10 are respectively connected to the multiple sets of input terminals (I/O1~I/On) 41. Besides, each of the first pins 13 of the multiple sets of touch electronic switches 10 is connected to a voltage source through a series-connected bias resistor, and the second pin 14 is electrically connected to a ground end. When any one of the touch electronic switches 10 is touched by the human body, the first pin 13 outputs a low potential to the main control chip 40. Therefore, the main control chip 40 can identify which set of touch electronic switches 10 is touched.

To sum up, the two-wire electronic switch apparatus of this invention can solve the shortcomings of traditional mechanical pushbutton switches and achieve versatile applications in electronic devices. It shall be understood that the present invention may have other types of embodiments, and a person with ordinary skills in the art of the technical field of the present invention may make various changes and modifications corresponding to the present invention without deviating the principle and substance of the present invention; however, such corresponding changes and modification shall be considered to be within the claimed scope of the present invention.

What is claimed is:

1. A two-wire electronic switching apparatus, comprising:
a touch pad;
a touch chip coupled to the touch pad, the touch chip comprising a touch sensor electrically connected to a controller, the controller connected to a gate of a field effect transistor;
a first pin and a second pin electrically connected to a source and a drain of the field effect transistor respectively;
wherein when the touch sensor senses that the touch pad is touched, the controller is configured to conduct the source and the drain of the field effect transistor to form a touch electronic switch.

2. The two-wire electronic switching apparatus in claim 1, wherein the touch chip is packaged on a first surface of a circuit board, the touch pad is arranged on a second surface of the circuit board, the two-wire electronic switching apparatus further comprising a cover plate covering the touch pad and providing a touch surface.

3. The two-wire electronic switching apparatus in claim 2, wherein the first pin and the second pin are soldered to a substrate of an electronic device.

4. The two-wire electronic switching apparatus in claim 1, wherein the touch pad is arranged on a back side of the touch chip, the first pin and the second pin are soldered to a surface of a circuit board.

5. The two-wire electronic switching apparatus in claim 1, wherein the first pin is electrically connected to an input terminal of a main control chip and is connected to a voltage source through a series-connected bias resistor, the second pin is electrically connected to a ground end, when the touch pad is touched, the first pin outputs a low potential to the input terminal of the main control chip.

6. The two-wire electronic switching apparatus in claim 1, wherein the first pin is electrically connected to a voltage source, the second pin is electrically connected to an input terminal of a main control chip and is connected to a ground end through a series-connected bias resistor, when the touch pad is touched, the second pin outputs a high potential to the input terminal of the main control chip.

7. The two-wire electronic switching apparatus in claim 1, wherein the first pin is electrically connected to an input terminal of a main control chip and is connected to a voltage source through a series-connected bias resistor, when the touch pad is touched, the first pin outputs one or more pulse signal voltage to the input terminal of the main control chip.

* * * * *